United States Patent
Das et al.

(10) Patent No.: US 9,912,334 B2
(45) Date of Patent: *Mar. 6, 2018

(54) METHOD AND CIRCUIT FOR DETECTION OF A FAULT EVENT

(71) Applicant: ARM Ltd., Cambridge (GB)

(72) Inventors: Shidhartha Das, Upper Cambourne (GB); Anand Savanth, Cambridge (GB); David Bull, Cambridge (GB)

(73) Assignee: ARM Ltd., Cambridge (GB)

( * ) Notice: Subject to any disclaimer, the term of this patent is extended or adjusted under 35 U.S.C. 154(b) by 0 days.

This patent is subject to a terminal disclaimer.

(21) Appl. No.: 15/453,646

(22) Filed: Mar. 8, 2017

(65) Prior Publication Data

US 2017/0207784 A1 Jul. 20, 2017

Related U.S. Application Data

(63) Continuation of application No. 14/980,117, filed on Dec. 28, 2015, now Pat. No. 9,621,161.

(51) Int. Cl.
*H03K 19/00* (2006.01)
*H03K 19/003* (2006.01)
*H03K 19/0175* (2006.01)

(52) U.S. Cl.
CPC . *H03K 19/00323* (2013.01); *H03K 19/00315* (2013.01); *H03K 19/017581* (2013.01)

(58) Field of Classification Search
CPC ............... H03K 19/00315; H03K 19/017581
USPC .................................................. 326/9, 14–15
See application file for complete search history.

(56) References Cited

U.S. PATENT DOCUMENTS

| | | | |
|---|---|---|---|
| 6,194,737 B1 * | 2/2001 | Ohshima | B82Y 10/00 257/30 |
| 6,882,578 B2 * | 4/2005 | Moore | G11C 11/406 365/189.15 |
| 7,298,640 B2 | 11/2007 | Chen et al. | |
| 7,639,523 B2 | 12/2009 | Celinska et al. | |
| 7,778,063 B2 | 8/2010 | Brubaker et al. | |
| 7,872,900 B2 | 1/2011 | Paz De Araujo et al. | |
| 8,773,887 B1 * | 7/2014 | Naji | G11C 11/165 365/148 |
| 9,558,819 B1 | 1/2017 | Aitken et al. | |
| 9,584,118 B1 | 2/2017 | Dao et al. | |
| 9,589,636 B1 | 3/2017 | Bhavnagarwala et al. | |
| 9,621,161 B1 * | 4/2017 | Das | H03K 19/00323 |

(Continued)

*Primary Examiner* — Jason M Crawford
(74) *Attorney, Agent, or Firm* — Berkeley Law & Technology Group, LLP

(57) ABSTRACT

According to one embodiment of the present disclosure, a circuit includes a Correlated Electron Switch (CES) element and a programming circuit. The CES element includes a first input. The first input of the CES element is coupled to an input signal to be monitored. The CES element is programmed in a first impedance state. The programming circuit coupled to the CES element is configured to switch the CES element from the first impedance state to a second impedance state in response to a voltage transition on the input signal. The voltage transition indicates a fault event. The output element coupled to the first input of the CES element determines that the transition has occurred responsive to the CES element switching to the second impedance state.

18 Claims, 11 Drawing Sheets

(56) References Cited

U.S. PATENT DOCUMENTS

| | | | |
|---|---|---|---|
| 2005/0122828 A1* | 6/2005 | Odagawa | G11C 11/16 365/232 |
| 2008/0106925 A1* | 5/2008 | Paz de Araujo | H01L 45/04 365/148 |
| 2008/0106926 A1* | 5/2008 | Brubaker | H01L 27/2409 365/148 |
| 2008/0107801 A1 | 5/2008 | Celinska et al. | |
| 2010/0073025 A1* | 3/2010 | Tanamoto | H03K 19/1776 326/41 |
| 2013/0200323 A1 | 8/2013 | Pham et al. | |
| 2013/0214232 A1 | 8/2013 | Tendulkar et al. | |
| 2013/0285699 A1 | 10/2013 | McWilliams et al. | |
| 2017/0033782 A1 | 2/2017 | Shifren et al. | |
| 2017/0045905 A1 | 2/2017 | Sandhu et al. | |
| 2017/0047116 A1 | 2/2017 | Sandhu et al. | |
| 2017/0047919 A1 | 2/2017 | Sandhu et al. | |
| 2017/0069378 A1 | 3/2017 | Shifren et al. | |
| 2017/0099049 A1* | 4/2017 | Sandhu | H03K 17/687 |

* cited by examiner

METHOD AND CIRCUIT FOR DETECTION OF A FAULT EVENT

This application is a continuation of U.S. patent application Ser. No. 14/980,117, titled METHOD AND CIRCUIT FOR DETECTION OF A FAULT EVENT, filed Dec. 28, 2015, and is incorporated herein by reference in its entirety.

FIELD OF THE INVENTION

The present techniques generally relate to methods and circuits for detecting a fault event, and more particularly to a fault event detection circuit comprising a correlated electron switch.

BACKGROUND

Circuits, in particular integrated circuits (IC), such as microprocessors, flip-flops, latches, memory cells, etc., experience voltage and/or current anomalies over the circuit lifetime due to the operating environment and/or the design of the circuits. The phrase 'voltage anomaly' and the phrase 'current anomaly' is referred to herein, and used interchangeably with, the term 'fault event'. Examples of a fault event include a Single-Event Upset (SEU), a fault due to accelerated ageing, and supply voltage non-idealities such as supply droops and/or ground bounce. Fault events may affect the reliable functioning of a circuit.

Reliability of a circuit becomes paramount in safety-critical applications, such as, automotive applications, medical applications, military applications and aerospace applications. The circuits used in the safety-critical applications may be subjected to extreme operating conditions, such as, extreme temperatures, radiation effects, and the like. Exposure to such extreme operating conditions increases susceptibility to reliability issues such as accelerated ageing of transistors, and/or an increased sensitivity to SEUs. Accelerated ageing is a phenomenon where a circuit begins to wear out rapidly in comparison with an expected life time of the circuit, leading to gradual slow-down in switching speeds that adversely impact circuit-timing assumptions. SEU may be an unwanted change in state in state-holding elements, or a transient voltage pulse at sensitive nodes in the ICs, such as, processors. Other fault events such as supply-voltage droops and ground bounce occur due to interactions of the IC with the associated circuitry that delivers power to the transistors in the IC. Such reliability and functional issues may cause a system malfunction which the circuits are a part of. The system malfunction may disrupt operation of the system, in particularly, safety-critical applications, leading to a loss of number of research hours, manpower, lives and/or investments. Identifying occurrences of the fault events and identifying the circuits exhibiting the fault events may help to understand the reliability and functionality issues of the circuits.

SUMMARY

According to a first aspect of the present technique, a circuit is provided. The circuit comprises a Correlated Electron Switch (CES) element, a programming circuit and an output element. The CES element includes a first input. The first input of the CES element is coupled to an input signal. The CES element is programmed in a first impedance state. The programming circuit coupled to the CES element is configured to switch the CES element from the first impedance state to a second impedance state in response to a voltage transition on the input signal. The voltage transition indicates a fault event. The output element coupled to the first input of the CES element determines that the transition on the input signal has occurred when the CES element switches to the second impedance state.

In embodiments, the programming circuit may further comprise: a capacitive element coupled to the input signal and the first input of the CES element, the capacitive element configured to induce a transient signal in response to the transition, wherein the programming circuit switches the CES element to the second impedance state based at least in part upon the transient voltage.

In embodiments, the circuit may comprise an input element comprising a transmission gate or a pulse generator, the input element configured to couple the transition on the input signal to the capacitive element.

The capacitive element may be an on-chip capacitor.

In embodiments, the output element may generate a flag signal responsive to the CES element switching to the second impedance state.

The transition may be due to a fault event. The fault event may comprise at least one of: an ageing-related timing failure, a single event upset, a voltage droop condition and a ground bounce condition.

In embodiments, the programming circuit further comprises: a first resistor coupled between the first input and a first supply voltage; and a first transistor coupled between a second input of the CES element and a second supply voltage, wherein the first transistor is configured to: turn on a current path through the CES element for a predetermined period of time; and turn off the current path after the predetermined period of time.

The programming circuit may, in embodiments, be configured to: supply a first signal to the CES element up to a first trigger level; provide a transient signal in addition to the first signal to cause the CES element to switch from the first impedance state to the second impedance state, wherein the first signal and the transient signal is one of a voltage and a current, wherein the first trigger level is one of a threshold voltage or a threshold current above which the CES element switches from the first impedance state to the second impedance state.

The circuit may further comprise a reset circuit configured to change the impedance state of the CES element from the second impedance state to the first impedance state.

In particular embodiments, the first impedance state may be a high impedance state and the second impedance state may be a low impedance state.

According to a second aspect of the present technique, a method is disclosed. The method includes detecting a transition on an input signal. In addition, the method includes switching a CES element from a first impedance state to a second impedance state responsive to the transition. The method also includes determining that the transition on the input signal has occurred responsive to the CES element switching (from the first impedance state to the second impedance state responsive to the transition). The transition on the input signal may be indicative of a fault event.

The method may further comprise: inducing a transient signal in response to the transition; and switching the CES element to the second impedance state based at least in part upon the transient signal.

The method may comprise: generating a flag signal indicating the transition in response to the CES element switching to the second impedance state.

In embodiments, the transition detected by the method is due to a fault event. The fault event may comprise at least one of: an ageing-related timing failure, a single event upset, a voltage droop condition and a ground bounce condition.

In embodiments of the method, the first impedance state may be a high impedance state and the second impedance state may be a low impedance state.

According to a third aspect of the present technique, an integrated circuit is disclosed. The integrated circuit includes at least one circuit element, and a transition monitor element. The transition monitor element monitors the at least one circuit element. The transition monitor includes a Correlated Electron Switch (CES) element, a programming circuit and an output element. The CES element includes a first input. The first input of the CES element is configured to receive an input signal. The CES element is configured in a first impedance state. The programming circuit is coupled to the CES element, and configured to switch the CES element from the first impedance state to a second impedance state in response to a transition on the input signal. The output element coupled to the first input of the CES element determines that the transition on the input signal has occurred when the CES element switches to the second impedance state.

The above features apply equally to the third aspect.

BRIEF DESCRIPTION OF DRAWINGS

The techniques are diagrammatically illustrated, by way of example, in the accompanying drawings, in which.

DETAILED DESCRIPTION

Figure 1:
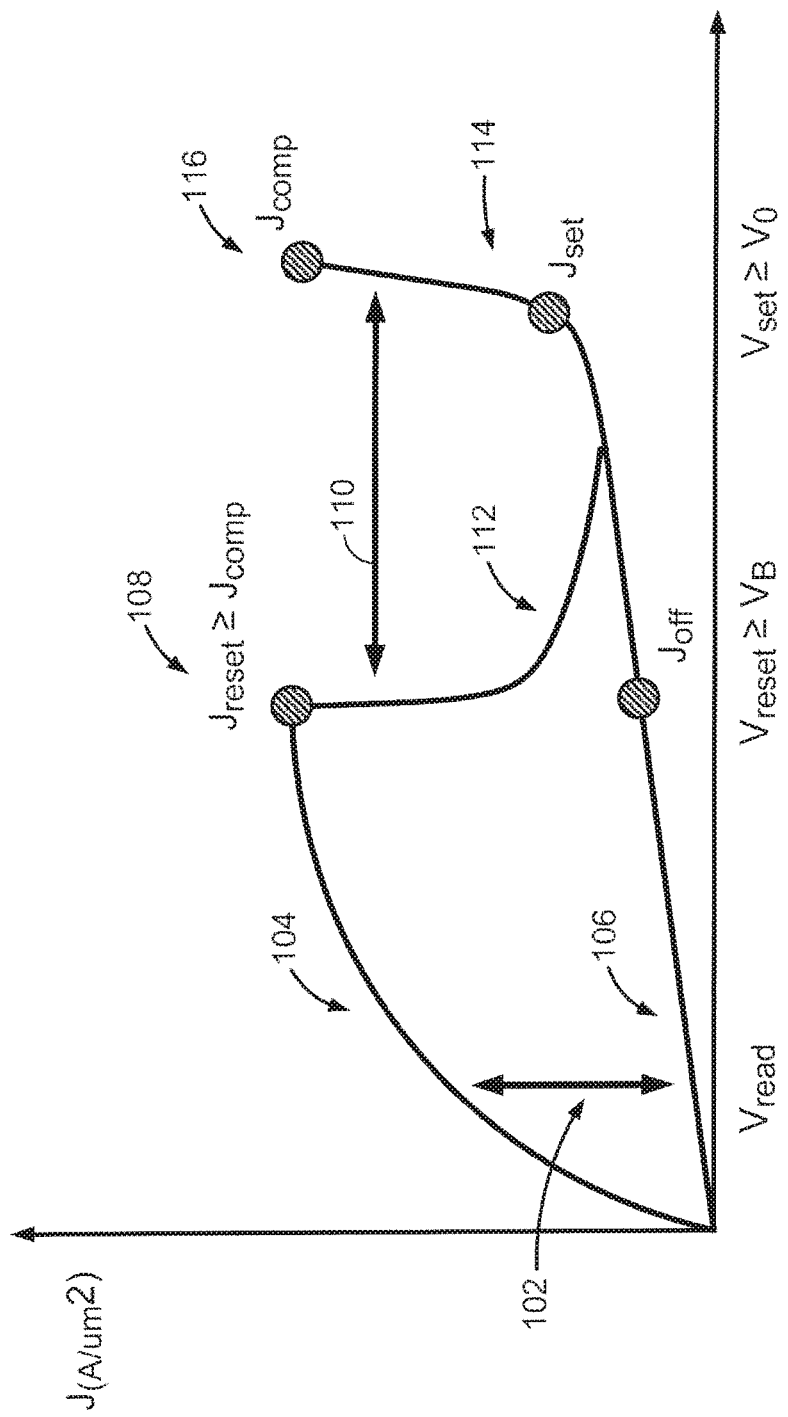
FIG. 1 shows a plot of current density versus voltage for a Correlated Electron Switch (CES) element.

Broadly speaking, embodiments of the present techniques provide a method and circuitry to monitor for fault events on an input signal, and switch a switch element from a first impedance state to a second impedance state in response to a voltage transition (fault event) on the input signal. The voltage transition indicates a fault event has occurred. Switching of the switch element enables detection of the fault event. As mentioned above, identifying occurrences of fault events and identifying the circuits exhibiting the fault events may help to understand the reliability and functionality issues of the circuits in which faults occur. The switch element which is switched from a first impedance state to a second impedance state may be a Correlated Electron Switch (CES) element, which comprises a correlated electron material (CEM). The CES element may be used both as non-volatile storage as well as a circuit element that can enable connectivity in a circuit. As explained in more detail below, the CES element comprises a material that may transition between predetermined detectable memory states based at least in part on a transition of (at least a portion of) the material between a conductive state and an insulative state. The CES element is programmable such that it may store a configuration in a non-volatile manner, and use its impedance state to enable connectivity.

The term "correlated electron switch" is used interchangeably herein with "CES", "CES element", "CES device", "correlated electron random access memory", "CeRAM", and "CeRAM device".

Non-volatile memories are a class of memory in which the memory cell or element does not lose its state after power supplied to the device is removed. In flash memory devices, an ability to keep random access (erase/write single bits) was sacrificed for speed and higher bit density. Flash remains a non-volatile memory of choice. Nevertheless, it is generally recognized that flash memory technology may not scale easily below 40 nanometers (nm); thus, new non-volatile memory devices capable of being scaled to smaller sizes are actively being sought.

A CES element is a particular type of switch formed (wholly or in part) from a CEM. Generally speaking, a CES element may exhibit an abrupt conductive or insulative state transition arising from electron correlations rather than solid state structural phase changes. (Examples of solid state structural phase changes include crystalline/amorphous in phase change memory (PCM) devices, or filamentary formation and conduction in resistive RAM devices, as discussed above). An abrupt conductor/insulator transition in a CES element may be responsive to a quantum mechanical phenomenon, in contrast to melting/solidification or filament formation.

A quantum mechanical transition of a CES element between an insulative state and a conductive state may be understood in terms of a Mott transition. In a Mott transition, a material may switch from an insulative state to a conductive state if a Mott transition condition occurs. When a critical carrier concentration is achieved such that a Mott criteria is met, the Mott transition will occur and the state will change from high resistance/impedance (or capacitance) to low resistance/impedance (or capacitance).

A "state" or "memory state" of the CES element may be dependent on the impedance state or conductive state of the CES element. In this context, the "state" or "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive and insulative states. As discussed in the particular example implementations below, material of a CES element sandwiched between conductive terminals may be placed in an insulative state by application of a first programming signal across the terminals having a voltage $V_{reset}$ and current $I_{reset}$ at a current density $J_{reset}$, or placed in a conductive state by application of a second programming signal across the terminals having a voltage $V_{set}$ and current $I_{set}$ at current density $J_{set}$.

Additionally or alternatively, a CES element may be provided as a memory cell in a cross-point memory array whereby the CES element may comprise a metal/CEM/metal (M/CEM/M) stack formed on a semiconductor. Such an M/CEM/M stack may be formed on a diode, for example. In example implementations, such a diode may be selected from the group consisting of a junction diode and a Schottky diode. In this context, it should be understood that "metal" means a conductor, that is, any material that acts like a metal, including, for example, polysilicon or a doped semiconductor.

FIG. 1 shows a plot of current density versus voltage across terminals (not shown) for a CES element. Based, at least in part, on a voltage applied to terminals of the CES element (e.g., in a write operation), the CES element may be placed in a conductive state or an insulative state. For example, application of a voltage $V_{set}$ and current density $J_{set}$ may place the CES element in a conductive memory state and application of a voltage $V_{reset}$ and a current density $J_{reset}$ may place the CES element in an insulative memory state.

Following placement of the CES element in an insulative state or conductive state, the particular state of the CES element may be detected by application of a voltage $V_{read}$ (e.g., in a read operation) and detection of, for example, a current or current density at terminals or bias across the terminals of the CES element.

Both the current and the voltage of the CES element need to be controlled in order to switch the CES element state. For example, if the CES element is in a conductive state, and voltage $V_{reset}$ required to place the device in an insulative memory state, is applied thereto, the CES element will not switch into the insulative state until the current density is also at the required value of $J_{reset}$. This means that, when the CES element is used to read/write from a memory, unintended rewrites may be prevented since even if sufficient voltage is applied to the CES element, a memory state change will only occur if the required current density is also applied.

The CES element of FIG. 1 may include any transition metal oxide (TMO), such as, for example, perovskites, Mott insulators, charge exchange insulators, and Anderson disorder insulators. In particular implementations, a CES element may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES device. In an embodiment, a CES element may be prepared without electroforming. Other implementations may employ other transition metal compounds without deviating from claimed subject matter. For example, {M(chxn)2Br}Br2 where M may comprise Pt, Pd, or Ni, and chxn comprises 1R,2R-cyclohexanediamine, and other such metal complexes may be used without deviating from claimed subject matter.

When sufficient bias is applied (e.g., exceeding a band-splitting potential) and the aforementioned Mott condition is met (injected electron holes=the electrons in a switching region), the CES element may rapidly switch from a conductive state to an insulative state via the Mott transition. This may occur at point 108 of the plot in FIG. 1. At this point, electrons are no longer screened and become localized. This correlation may result in a strong electron-electron interaction potential which splits the bands to form an insulator. While the CES element is still in the insulative state, current may be generated by transportation of electron holes. When sufficient bias is applied across terminals of the CES element, electrons may be injected into a metal-insulator-metal (MIM) diode over the potential barrier of the MIM device. When sufficient electrons have been injected and sufficient potential is applied across terminals to place the CES element in a set state, an increase in electrons may screen electrons and remove a localization of electrons, which may collapse the band-splitting potential forming a metal.

Current in a CES element may be controlled by an externally applied "compliance" condition determined based, at least in part, on the external current limited during a write operation to place the CES element in a conductive state. This externally applied compliance current may also set a condition of a current density for a subsequent reset operation to place the CES element in an insulative state.

As shown in the particular implementation of FIG. 1, a current density $J_{comp}$ applied during a write operation at point 116 to place the CES element in a conductive state may determine a compliance condition for placing the CES element in an insulative state in a subsequent write operation. For example, the CES element may be subsequently placed in an insulative state by application of a current density $J_{reset} \geq J_{comp}$ at a voltage $V_{reset}$ at point 108, where $J_{comp}$ is externally applied.

The compliance condition therefore may set a number of electrons in a CES element which are to be "captured" by holes for the Mott transition. In other words, a current applied in a write operation to place a CES element in a conductive memory state may determine a number of holes to be injected to the CES element for subsequently transitioning the CES element to an insulative memory state.

As pointed out above, a reset condition may occur in response to a Mott transition at point 108. As pointed out above, such a Mott transition may occur at condition in a CES element in which a concentration of electrons n equals a concentration of electron holes p.

A current or current density in a region 104 of the plot shown in FIG. 1 may exist in response to injection of holes from a voltage signal applied across terminals of a CES element. Here, injection of holes may meet a Mott transition criterion for the conductive state to insulative state transition at current IMI as a critical voltage VMI is applied across terminals of CES element.

A "read window" 102 for detecting a memory state of a CES element in a read operation may be set out as a difference between a portion 106 of the plot of FIG. 1 while the CES element is in an insulative state, and a portion 104 of the plot of FIG. 1 while the CES element is in a conductive state at a read voltage $V_{read}$.

Similarly, a "write window" 110 for placing a CES element in an insulative or conductive memory state in a write operation may be set out as a difference between $V_{reset}$(at $J_{reset}$) and $V_{set}$(at $J_{set}$). Establishing $|V_{set}|>|V_{reset}|$ enables a switch between conductive and insulative states. $V_{reset}$ may be approximately at a band splitting potential arising from correlation and $V_{set}$ may be approximately twice the band splitting potential. In particular implementations, a size of write window 110 may be determined, at least in part, by materials and doping of the CES element. The transition from high resistance (or high capacitance) to low resistance (or low capacitance) can be represented by a singular impedance of the device.

Figure 2:
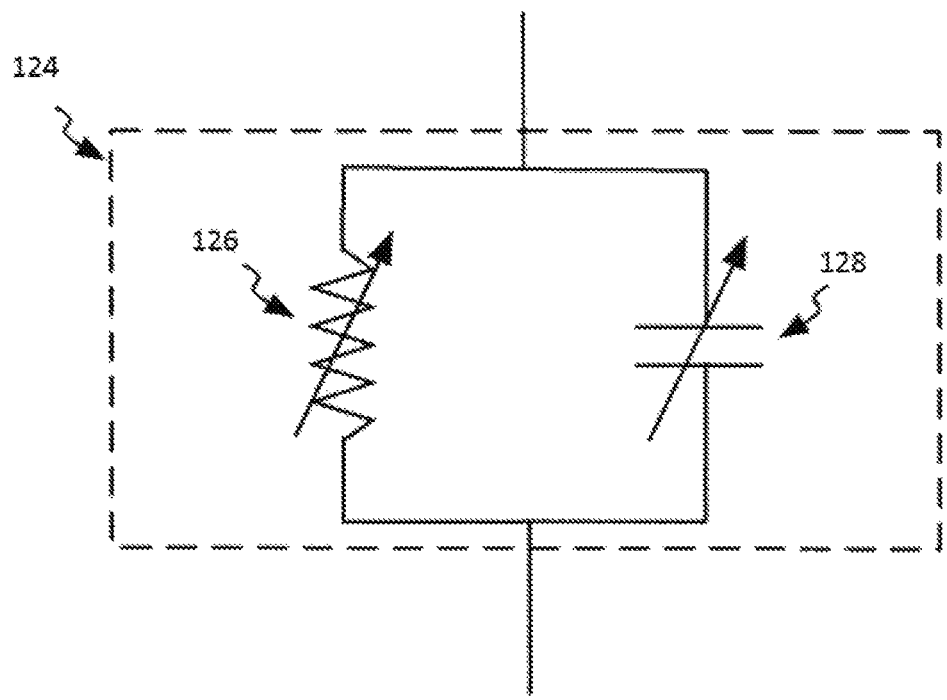
FIG. 2 is a schematic diagram of an equivalent circuit to a CES device/element.

FIG. 2 depicts a schematic diagram of an equivalent circuit of an example variable impeder device (such as a CES device), such as variable impeder device 124. As mentioned, variable impeder device 124 may comprise characteristics of both variable resistance and variable capacitance. For example, an equivalent circuit for a variable impeder device may, in an embodiment, comprise a variable resistor, such as variable resistor 126 in parallel with a variable capacitor, such as variable capacitor 128. Although the variable resistor 126 and variable capacitor 128 are depicted in FIG. 2 as discrete components, variable impeder device 124 may equally comprise a substantially homogenous CES element, wherein the CES element comprises characteristics of variable capacitance and variable resistance. Table 1 below depicts an example truth table for an example variable impedance device, such as variable impeder device 124.

TABLE 1

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})$~0 | $Z_{low}(V_{applied})$ |

Figure 3:
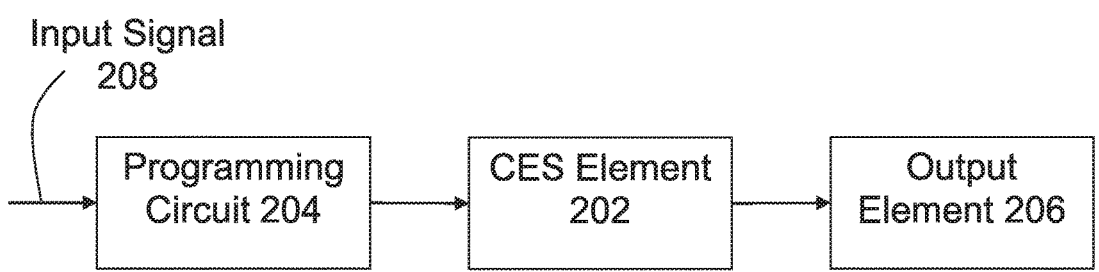
FIG. 3 illustrates a schematic view of an exemplary circuit, according to one embodiment of the present disclosure.

FIG. 3 shows a schematic view of an exemplary circuit 200 for monitoring a fault event, according to one embodiment. The circuit 200 comprises a Correlated Electron Switch (CES) element 202. In one embodiment, the CES 202 is initially programmed at a first impedance state. An impedance state of the CES element 202 may correspond to a resistive state, a capacitive state, or a combination thereof. In an example, implementation, the CES element 202 may be programmed to a high impedance state.

The circuit 200 further includes a programming circuit 204 and an output element 206. The programming circuit 204 coupled to the CES element 202, sets up the CES element 202 for recording the fault event. The programming circuit 204 provides a first signal to the CES element 202. In an embodiment, the first signal is defined to be within a first trigger level. The first trigger level may be a first threshold voltage and/or a first threshold current. In one embodiment, the first threshold voltage is the SET voltage of the CES element 202 and the first threshold current is the SET current of the CES element 202. At the high impedance state, the CES element 202 exhibits a high resistance path, allowing less current to pass through. The CES element 202 switches to a low impedance state responsive to a first programming current (or a programming current density) and a first programming voltage at or above the SET current and the SET voltage, respectively. The programming circuit 204 provides the programming current (or a programming current density) and/or the programming voltage in response to a transition at an input signal 208 as a result of the fault event. In one example, the transition may be a voltage transition. In another example, the transition may be a current transition. The input signal may be coupled to a circuit element (not shown) to which the circuit 200 is associated with. The transition may be a transient signal.

The circuit 200 monitors the input signal 208 for the transition. In one embodiment, the circuit 200 may be enabled for a determined duration. In alternative embodiments, the circuit 200 may be enabled continuously, periodically or at random. In response to a transition at the input signal 208, the programming circuit 204 provides a first programming voltage and a first programming current to the CES element 202 so that the CES 202 element switches from the high impedance state to the low impedance state responsive to the transition. In an embodiment, the transition on the input signal 208 may be indicative of an occurrence of a fault event. Thus, the switching from the high impedance state to the low impedance state may also be indicative of the occurrence of the fault event in the circuit element. The circuit 200 is designed to maintain the CES element 202 in the low impedance state, till the CES element 202 is reset to the high impedance state.

The output element 206 coupled to the CES element 202 identifies a state change in the CES element 202 from the high impedance state to the low impedance state. In response to identifying the state change, the output element 206 generates a flag indicating the occurrence of the fault event.

The CES element 202 may be reset by switching from the low impedance state to a high impedance state. In one embodiment, the CES element 202 is reset by providing a second programming signal to the CES element 202 at a second trigger level. The second programming signal includes a second programming current (or a programming current density) and/or a second programming voltage. The second trigger level may be a second threshold voltage or a second threshold current. In an embodiment, the second threshold voltage is the RESET voltage and the second threshold current is the RESET current. In one example design specification, the second trigger level is defined to be about 0.6 volts, but this is merely an illustrative, non-limiting example. In other example design specifications, the second trigger voltage can vary. The CES element 202 switches to the high impedance state responsive to the second programming current (or a second programming current density) and the second programming voltage at or above the RESET current and the RESET voltage, respectively.

The circuit 200 monitors occurrence of fault events at an observation node of a circuit element under observation. The circuit 200 monitors the fault events by observing the transition at the observation node due to the fault events. The observation node may be a sensitive node, a timing-end point, a processor architectural-state register, a flip-flop, a latch, a memory cell, a circuit junction, a power delivery network, and the like. The circuit element under observation may, for example, include a functional unit such as processor, memory and the like, or a power network. The fault events may include a Single-Event Upset (SEU), a fault due to a circuit ageing, a voltage droop condition, or a ground bounce condition. The SEU is a change in state or a transient voltage pulse at sensitive nodes in an integrated circuit. The fault event due to the circuit ageing is improper functioning of integrated circuits due to wearing off or excessive stress on circuits. The voltage droop condition is a loss of an output voltage while driving excessive loads from a same source. The ground bounce condition is a temporary change in ground voltage as a result of simultaneous state change on input/output pins in the integrated circuit. A flag generated by the circuit 200 can be used by the designer/tester for off-line debugging and possible identification of a failing state of the circuit element.

As described above, the circuit 200 is an in situ fault monitor circuit. Unlike known art where fault monitor circuits are external circuits coupled to the circuit element under observation for monitoring the fault event, the circuit 200 may be a part of the circuit element under observation to monitor fault events. Furthermore, unlike the fault monitor circuits in the known art, the CES-based fault monitor circuit has a characteristic of non-volatile state retention that holds the record of the fault event.

The CES element 202 is an impedance based memory component for storing data. In current disclosure, impedance and memory properties of the CES element 202 are used in identifying the occurrence of the fault events. As described, the CES element 202 is used to record an occurrence of the fault event in form of an impedance state change. In one example design specification, the first trigger level is defined to be 1.2 volts, but this is merely an illustrative, non-limiting example. In other design specifications, the first trigger level can vary according to manufacturing of the CES element(s).

The programming circuit 204 is a part of the circuit 200 designed to engineer an impedance state change of the CES element 202. The programming circuit 204 provides a supply up to the first trigger level, or at a second trigger level to set the CES element 202 for a required impedance state. The programming circuit 204 includes various elements designed to achieve the aforementioned supplies to the CES element 202.

In an embodiment, the circuit 200 may also be implemented as an external fault monitor. The impedance state, for example, the low impedance state, of the CES element 202 serves as a sticky-latch for off-line debugging and identification of failing elements in the circuit element under observation. A non-volatile nature of the CES element 202 enables the circuit 200 to persistently record the occurrence in the CES element 202. Although, FIG. 3 illustrates the circuit 200 for a circuit element, the circuit element can have more than one circuit 200 to monitor nodes for the fault event.

Figure 4:
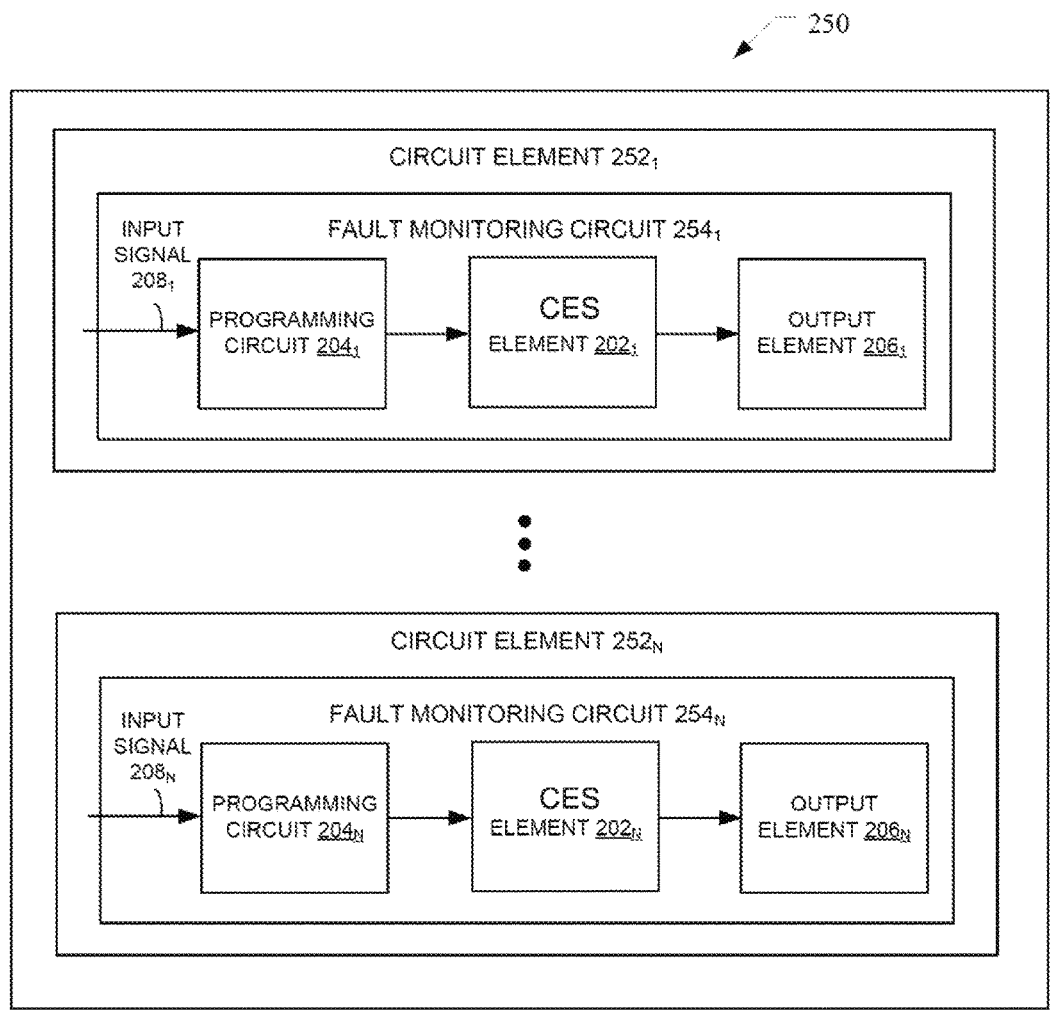
FIG. 4 illustrates a schematic view of an exemplary Integrated Circuit, according to one embodiment of the present disclosure.

FIG. 4 illustrates a schematic view of an Integrated Circuit (IC) 250, according to one embodiment of the present disclosure. The IC 250 may include a plurality of circuit elements $252_{1-N}$ and a plurality of fault monitor circuits $254_{1-N}$. The fault monitor circuit $254_{1-N}$ as described herein may be implemented using the circuit 200, according to one embodiment. Each of the circuit elements $252_{1-N}$ may have a defined function in the IC 250. FIG. 4 illustrates a fault monitor circuit $254_{1-N}$ for each of the circuit elements $252_{1-N}$. The fault monitor circuit $254_{1-N}$ is an in situ fault monitoring unit for monitoring a fault event. The fault monitor circuits $254_{1-N}$ may be placed at appropriate nodes of the circuit elements at which the fault event is to be monitored. Each fault monitor circuit $254_{1-N}$ includes a corresponding programming circuit $204_{1-N}$, a CES element $202_{1-N}$ and an output element $206_{1-N}$. The functionalities of the programming circuit $204_{1-N}$, a CES element $202_{1-N}$ and an output element $206_{1-N}$ are same as the corresponding circuit elements described in FIG. 3.

In response to identifying a fault event in any of the circuit element $252_{1-N}$, a corresponding fault monitoring circuit $254_{1-N}$ generates a flag output. The outputs of one or more such fault monitoring circuits $254_{1-N}$ may be combined to generate a single fault indication. The single fault indication helps a designer/tester in identifying that the IC is exhibiting a fault event. Further, the IC may provide a memory unit (not shown) to receive the flag outputs. The designer/tester may use the memory unit to trace back to a corresponding circuit element exhibiting the fault event. Furthermore, the flag outputs can be obtained to generate a fine grained map of faulty circuits for offline diagnosis. As a result, the circuit elements exhibiting the fault event can be precisely identified and probed further. Upon completing diagnostics and failure analysis, all CES elements within the fault monitor circuits of the IC can be reset to the first impedance state using reset circuitry (not shown) so that the fault monitoring circuits can be reused for subsequent failures.

Figure 5:
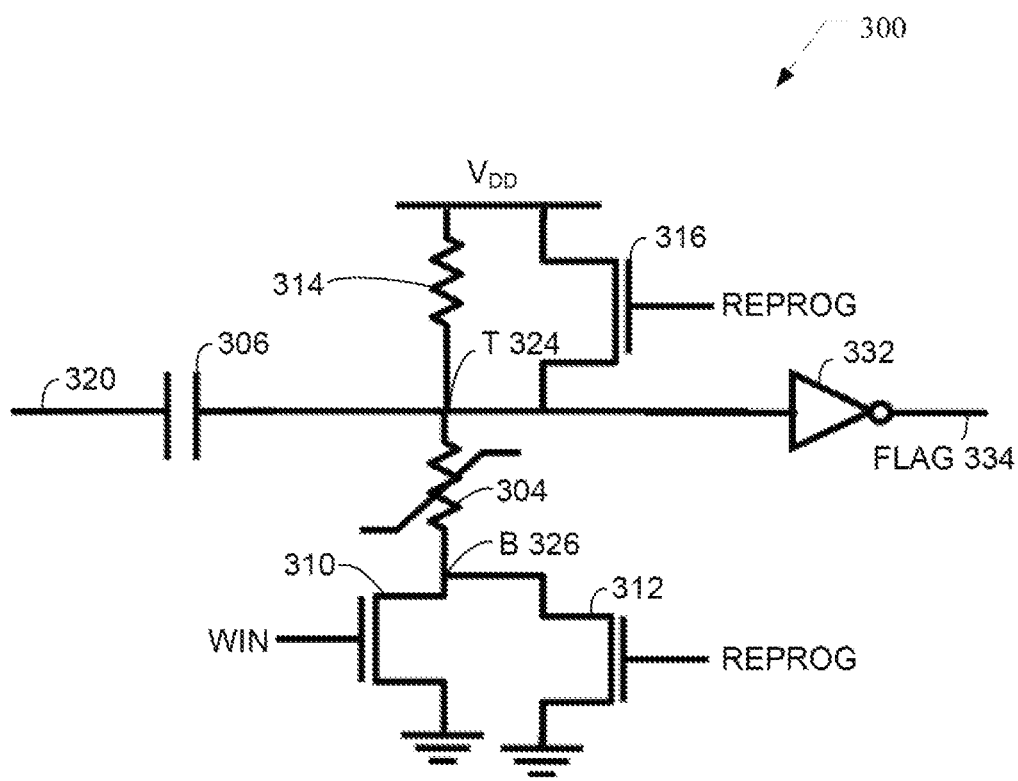
FIG. 5 illustrates an exemplary implementation of the circuit of FIG. 3, according to one embodiment of the present disclosure.

FIG. 5 is an exemplary circuit 300, according to one embodiment. FIG. 5 is an example implementation of the circuit 200. The circuit 300 comprises a CES element 304 and a capacitor 306.

The CES element 304 comprises a first input and a second input. The first input of the CES element 304 is coupled to a resistor 314 at a node 'T' 324, and the second input of the CES element 304 is coupled to a source input of N-channel Metal-Oxide-Semiconductor (NMOS) transistor 310 at a node 'B' 326. The capacitor 306 is coupled to the CES element 304 at node T 324. In an embodiment, the capacitor 306 is an on-chip capacitor. The capacitor 306 is configured to provide a transient voltage and a compliance current in response to a transition on an input signal 320. The resistor 314 is coupled to a supply voltage $V_{DD}$. In the current embodiment, the $V_{DD}$ is set to about 1 volt. A drain input of the NMOS transistor 310 is coupled to a ground, and a gate input of the NMOS transistor 310 is coupled to a WIN signal. The WIN signal represents a time-window that is generated as the function of a rising-edge triggered clock for the circuit element under observation, where timing-checks are performed. In current embodiment, the circuit 300 is configured to detect the transition on the input signal 320 at intervals defined by the WIN signal.

In one implementation, the CES element 304 is programmed to a high impedance state. In an example, an impedance value of the CES element is about 10M Ohm at the high impedance state. When the WIN signal goes high (that is 1 volt), a circuit path is set through a stack comprising the resistor 314, the CES element 304, and the NMOS transistor 310. The resistor 314 and the CES element 304 form a potential divider. A resistance value of the resistor 314 may be chosen such that a voltage drop across the CES element 304 is significantly higher than the voltage drop across the resistor 314. In an embodiment, the resistance value of the resistor 314 is lower than the resistance value of the CES element 304 in the high impedance state by at least an order of 10. In an example, when the resistance value of the CES element 304 in the high impedance state is about 10M Ohm, the resistance value of the resistor 314 may be less than or equal to 1M Ohm. The CES element 304 being in the high impedance state exhibits a high resistance along the circuit path, causing a minimal current leakage. Thus, the voltage drop across the CES element 304 is approximately equal to $V_{DD}$, i.e. at approximately at 1 volt according to an example implementation. In current example, a voltage to switch the CES element 304 to a low impedance state (hereinafter, referred to as a SET voltage) is about 1.2 volts. As the voltage drop across the CES element 304 is lower than the SET voltage, the CES element 304 continues to remain in the high impedance state. As a result, a voltage and a current in the circuit path would remain unchanged through the WIN duration. Also, since the CES element 304 continues to be in the high impedance state, the node T 324 is at the $V_{DD}$ and the node B 326 is at 0V, the voltage difference across the node T 324 and the node B 326 is almost equal to full voltage supply $V_{DD}$, which is 1 volt. An inverter 332, which is an output element in the current embodiment, provides a low signal on a flag 334 responsive to the node T 324 being at $V_{DD}$ (1 volt). The low signal on the flag 334 indicates that there is no change of state of the CES element 304 to a low impedance state. Also, the low signal indicates that there was no transition on the input signal 320.

When a positive voltage transition occurs on the input signal 320 during the WIN duration, the capacitor 306 coupled to the input signal 320 receives the voltage transition. The capacitor 306 induces a transient voltage at the node T 324 responsive to the voltage transition. In an embodiment, the capacitor 306 is a MOS-gate capacitor. The transient voltage induced at the node T 324 is a fraction of an input voltage on the input signal 320 due to parasitic capacitance to ground. The parasitic capacitance is due to capacitors to a bulk. The induced transient voltage at the node T 324 is defined by:

$$V = \frac{Cc}{Cc + Cg} V_i; \qquad 1$$

where Cc is a capacitance of the capacitor 306, and Cg is the parasitic capacitance to ground, the $V_i$ is the input voltage. Proportional to the transient voltage, the capacitor 306 may also source a compliance current for the CES element 304. In an example, the compliance current is 10 uA. The capacitor 306 is designed with appropriate sizes to induce a transient voltage and source the compliance current such that the CES element 304 switches to the low impedance state. In one embodiment, the capacitor 306 is designed using transistor gate-capacitors that are larger than minimum-sized devices, for example, 0.08 um². In one example implementation, if the SET voltage is 1.2 volt, the capacitor 306 is designed to induce the transient voltage of around 200 millivolt to around 300 millivolt. In alternative implementations, the induced transient voltage can be varied by increasing size of the gate input, or increasing gate length of the MOS-gate transistor. By increasing the size or length of the gate, the parasitic capacitance reduces a voltage value that is being coupled. The induced voltage at the node T 324 causes an instantaneous voltage at the node T 324 to rise to above 1.2 volt.

When the instantaneous voltage at the node T 324 rises to about 1.2 volts and the compliance current of above 10 uA, the CES element 304 switches from the high impedance state to the low impedance state. Consequently, the CES element 304 allows a high amount of current, which significantly reduces the voltage across the CES element 304. In an example implementation, the voltage difference between the node T 324 and the node B 326 reduces to a substantially low value or 0 (zero) volt. The substantially low value or a zero volt at the node T 324 triggers the inverter 332 to generate a high signal on the flag 334. The flag 334 indicates there has been an impedance state change from the high impedance state to the low impedance state in the CES element 304. The change in state from the high impedance state to the low impedance state indicates that a fault event has occurred in the circuit element under observation, and that the CES element 304 has recorded the fault event.

The circuit 300 is designed to detect any positive transition on the input signal 320. The circuit may be modified to detect a low transition voltage on the input signal 320. For example, a pulse generator may be used to receive the positive transition or the negative transition. The pulse generator may convey a pulse to the capacitor 306, responsive to the positive transition or a negative transition.

When the CES element 304 is in a high impedance state, the flag 334 stays low or at 0V irrespective of the state of the WIN signal. In the case where the CES element 304 is in the low impedance state, then the flag 334 goes 0V when the WIN signal is 0V, as there is no current flowing through the CES element 304 and the node T 324 is pulled up to $V_{DD}$, thereby driving down the flag 334. When the WIN signal is pulsed, the CES element 304 in the low impedance state pulls the node T 324 and the flag 334 is then set to high. Thus, the flag 334 goes high when the CES element 304 is in the low impedance state and the WIN signal is pulsed. Therefore, in such situations, the flag 334 is latched at falling edge of the WIN to avoid impedance change at the CES element 304 due to transients during the power up.

The circuit 300 is designed to persistently maintain the CES element 304 at the low impedance state until the reset. To elaborate, the transition on the input signal 320 does not affect the low impedance state of the CES element 304 when the WIN signal is zero (0). Furthermore, when the WIN signal is high and the CES element 304 is in the low impedance state, any transition on the input signal 320 does not impact the CES element 304 due to the low impedance state. In addition, a potential divider implemented by virtue of design through the resistor 314 and the CES element 304 reduces any transitions at the node T 234 to substantially low value or 0 (zero) volt.

The CES element 304 can be reset to the high impedance state from the low impedance state. The circuit 300 includes a reset circuit to reset the CES element 304. In current example implementation, the reset circuit includes an NMOS transistor 312 and an NMOS transistor 316. A source input of the NMOS transistor 312 is coupled to the node B 326, and a drain input of the NMOS transistor 312 is coupled to ground. A source input of the NMOS transistor 316 is coupled to the supply voltage $V_{DD}$, and a drain input of the NMOS transistor 316 is coupled to the node T 324. The gate inputs of the NMOS transistors 312 and the NMOS transistor 316 are connected to a REPROG signal.

The REPROG signal is an enable signal for reprogramming the CES element 304 from the low impedance state to the high impedance state. If a transition has been detected, and a flag generated, diagnostics and failure analysis is performed to determine what sort of fault event has occurred. Following the analysis, all CES elements within the fault monitor circuits can be reset to the first impedance state (using a REPROG signal) so that the fault monitoring circuits can be reused for subsequent failures. Responsive to the REPROG signal set to high, the NMOS transistor 312 and NMOS transistor 316 are switched ON, and a circuit path is set between the NMOS transistor 316, the CES 304 and the NMOS transistors 312. The NMOS transistors 312 and 316 are designed such that a voltage across the CES element 304 is greater than the RESET voltage. Further, a compliance current required to switch the CES element 304 is provided by the NMOS transistor 312 and the NMOS transistor 316. This causes the CES element 304 to switch from the low impedance state to the high impedance state.

In an embodiment, the resistor 314 may be a poly Resistor. The resistor 314 may also be implemented using a transistor (for example, biased at the linear region), or using another CES element. In one embodiment, value of the resistor 314 is chosen to be ten times higher than a low impedance state of the CES element 304, and ten times lower than the high impedance state of the CES element 304. In the current example implementation, a low impedance value of the CES element 304 is equal to 100K Ohm, and a high impedance value of the CES element 304 is around 10M Ohm. Thus, in accordance with the example implementation, the value of the resistor 314 is chosen to 1M Ohm. The value is chosen to implement a potential divider using the resistor 314 and the CES element 304. The resistor 314 may be implemented using a poly Resistor (for example, implemented at 1M resistance at an area cost of 50 sq. micron), a transistor (for example, biased at the linear region), or using another CES element configured at a low resistance state.

If another CES element used to implement the resistor 314, the impedance value may be about 100K Ohm at the low resistance state. When the CES element 304 is a high resistance state, the resistance of the another CES element (about 100K Ohm) being at least two (2) orders of magnitude lower in magnitude than the resistance of the CES element 304, results in voltage at the node T 324 around the $V_{DD}$. On the other hand, when the CES element 304 is in a low resistance state, the voltage at the node T 324 becomes about $V_{DD}/2$. In such a scenario, additional elements may be required to pull-down the node T 324 to zero voltage. In an example, the inverter 332 may be used with an additional PMOS transistor or an additional NMOS transistor (not shown) in a feedback loop. The inverter 332 output may be used to pull-down the node T 324 to 0V. In one example, the additional NMOS transistor may be used by coupling a gate input of the additional NMOS transistor to the flag 334 (output) of the inverter 332, a drain input to the node T 234, and a source input to the ground. Furthermore, with the node T 324 at $V_{DD}/2$, the flag 334 of the inverter 332 would be switched to value to higher than zero. The flag 334 with sufficient bias turns 'On' the additional NMOS transistor. The additional NMOS transistor will pull the node T 234 to ground by providing an extra current path through a positive feedback. Higher the pull from the additional NMOS transistor, higher the rise flag 334 signal rises. The higher the flag 334, stronger the additional NMOS discharge path resulting in lower value on the node T 324, ultimately leading to near zero voltage.

Although the circuit 300 is illustrated to have NMOS transistors, the circuit 300 can be modified to have P-Channel Metal-Oxide-Semiconductor (PMOS) transistors, and a combination of NMOS and PMOS transistors, without affecting the function of the circuit 300. Also, alternative circuit components can be used altogether to achieve the above functionality, without departing from the scope of the disclosure.

Figure 6:
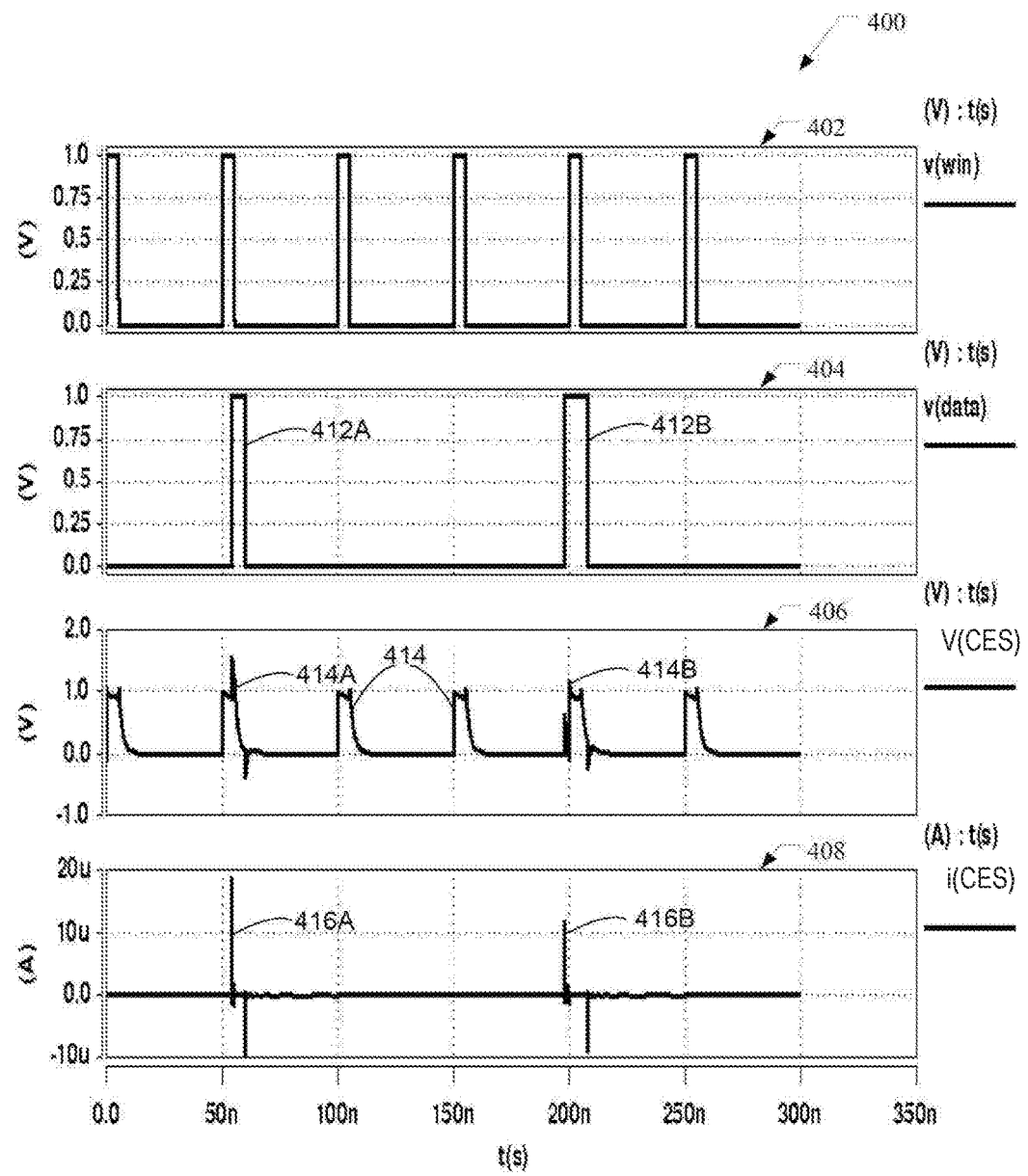
FIG. 6 illustrates an exemplary result of a simulation of the circuit for detecting fault events, according to one embodiment.

FIG. 6 illustrates an exemplary graph 400 of simulation of the circuit 300, according to one embodiment. FIG. 6 shows four sub graphs: a first sub graph 402, a second sub graph 404, a third sub graph 406, and a fourth sub graph 408. The first sub graph 402 shows a WIN signal in a voltage versus time graph. The WIN signal represents voltage pulses that are generated as the function of a rising-edge triggered clock v(win) for a circuit element under observation. The second sub graph 404 shows transitions 412A-B on the input signal 320. The transitions 412A-B represents a voltage v(data) on the input signal as a result of fault events. The third sub graph 406 illustrates voltages v(CES) across the CES element 304 responsive to the WIN signal and the transitions on the input signal 320. The fourth sub graph 408 illustrates a current i(CES) through the CES element 304.

As can be seen, the transition 412A occurs during the time that WIN signal is high. Therefore, the transition 412A may be termed indicative of a fault. Further, it can be seen that in response to the transition 412A, the induced transient voltage causes the voltage across the CES element to exceed 1.2 volt. Further, the current 414A provided by the capacitor 306 exceeds 10 uA which is the compliance current of the CES element 304. As a result, the CES element 304 switches from the high resistance state to the low resistance state. Consequently, as explained in conjunction with FIG. 5, the voltage across the CES element 304 drops to zero volt. This can be seen from the sub graph 406. Further, the transition 412B illustrates another transition on the input signal 320. The transition 412B may be termed as a safe transition, occurs when the WIN signal is low. As can be seen, the voltage across the CES element 304 rises up to about 0.5 volt. As the voltage across the CES element 304 is below the SET voltage, the CES element 304 does not switch from the high resistance state to the low resistance state. The simulation results merely indicate the transition on the input signal 320 and the effects on the CES element 304. It should be noted that the simulation does not capture a voltage and a current responses due to persistent low impedance state of the CES element 304 by the circuit 300. The simulation is merely illustrative and should not be construed to be limiting the scope of the disclosure.

Figure 7:
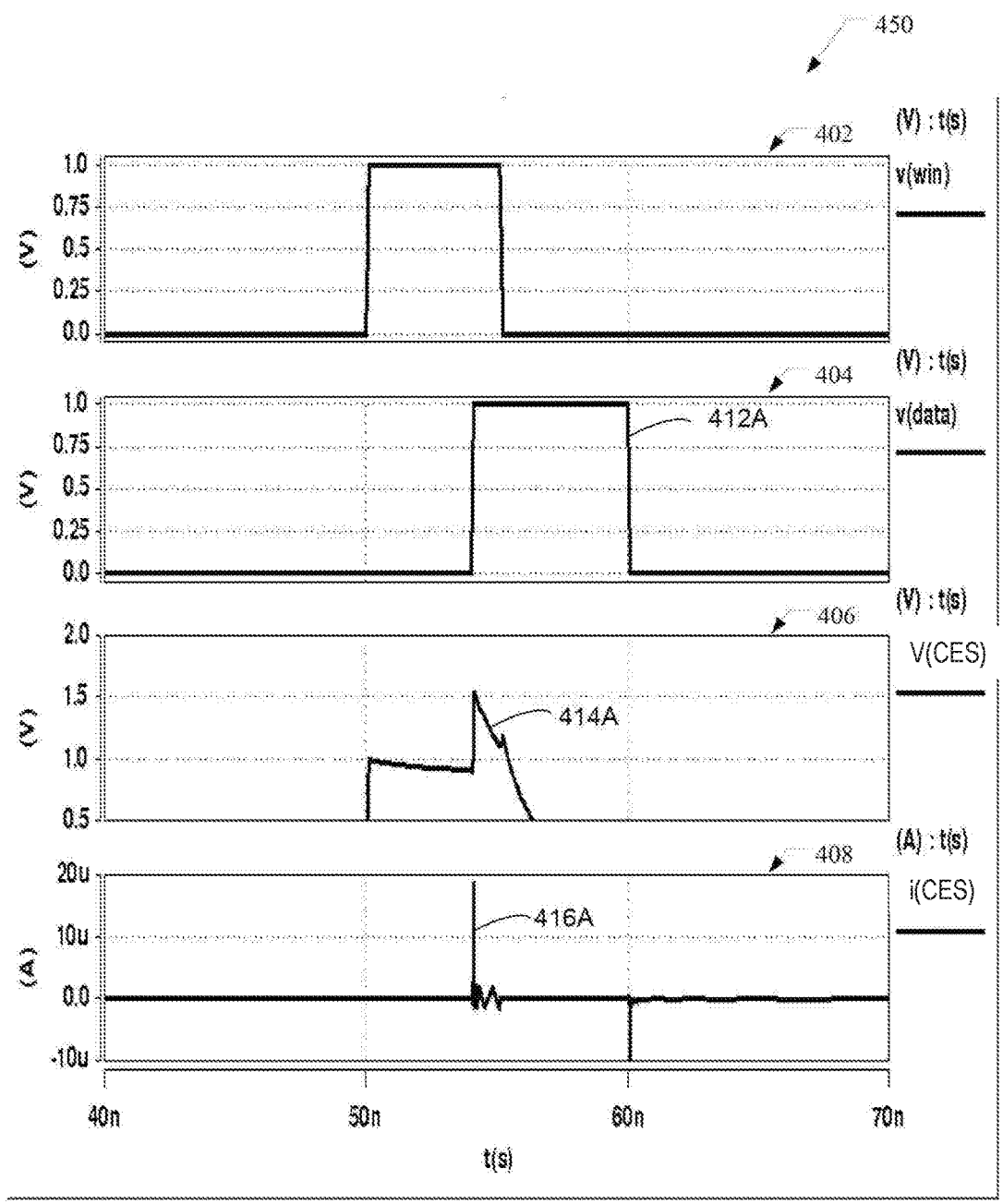
FIG. 7 illustrates an enlarged version of a section of a graph corresponding to a first transition, according to one embodiment.

FIG. 7 illustrates an enlarged version of a section 450 of graph 400 corresponding to the transition 412A. It can be seen in that in response to the WIN signal, there is a voltage of 1.0 V across the CES element 304. As shown, a transition occurs during the WIN signal. In response to the transition 412A, the CES element 304 switches state to the lower impedance state. As a result, the transient voltage 414A is induced. Further, the induced transient voltage 414A causes the voltage across the CES element 304 to around 1.5 volt, which is shown in the figure. FIG. 7 also illustrates the compliance current 416A provided by the capacitor 306 responsive to the transition. As shown, the compliance current 416A provided by the capacitor 306 exceeds 10 uA. In response to the voltage 414A of 1.5V and the compliance current 416A, the CES element 304 switches from the high impedance state to the low impedance state. As a result of switching, the voltage across the CES element 304 is shown to drops to zero volt.

Figure 8:
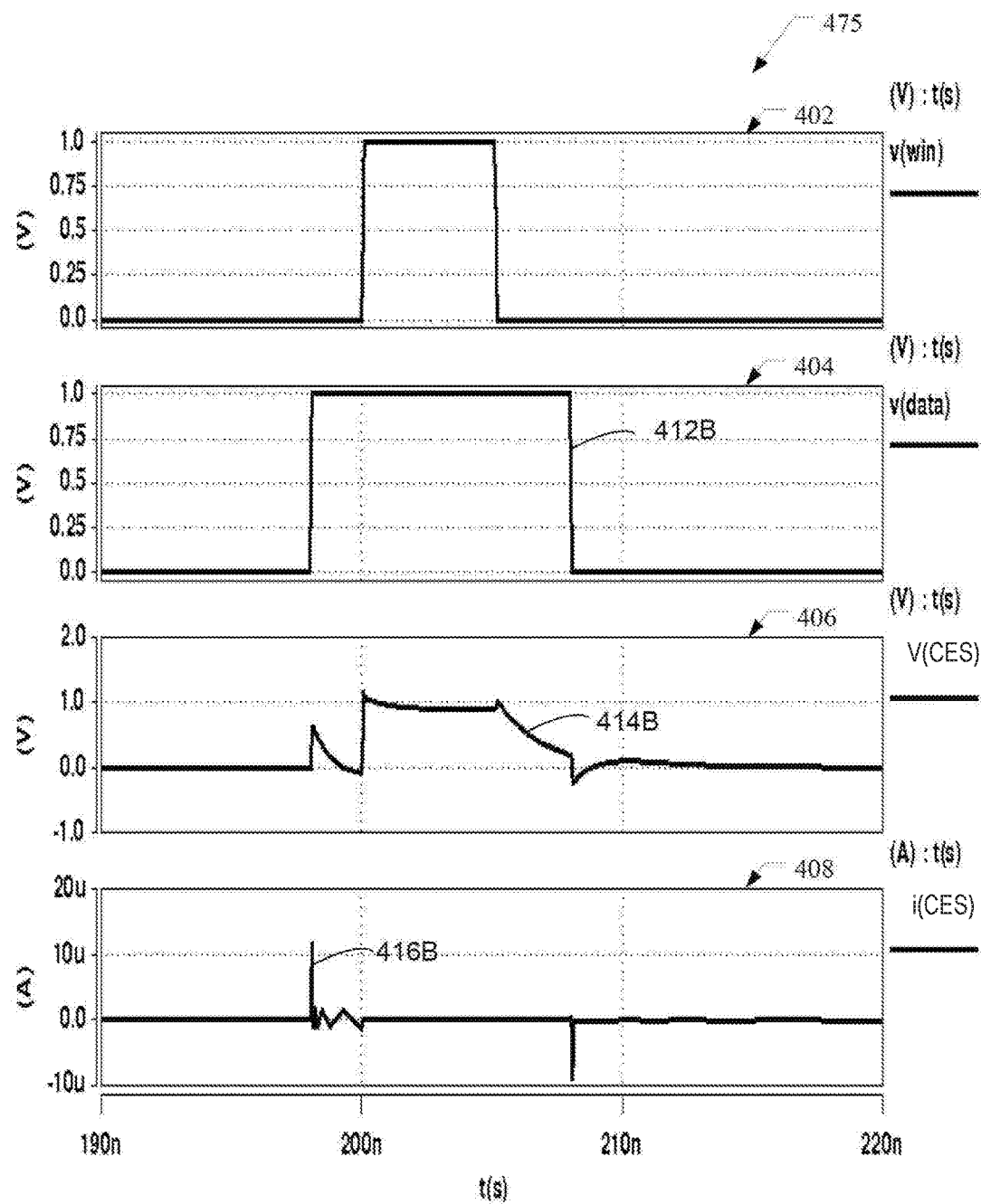
FIG. 8 illustrates an enlarged version of a section of a graph corresponding to a second transition, according to one embodiment.

FIG. 8 illustrates an enlarged version of a section 475 of graph 400 corresponding to the transition 412A. The section 475 illustrates the transition 412A during the WIN signal. The voltage 414B across the CES element 304 is a response to the safe transition. As shown in the figure, the voltage 414B is seen rising to 0.5 volt initially in response to the transition. Further, the voltage 414B across the CES element 304 is shown to be increasing to about 1 volt in response to the WIN signal being high. FIG. 8 also illustrates the compliance current 416B provided by the capacitor 306 in response to the transition. The compliance current 416B as shown exceeds 10 uA. The voltage of 1.V does not meet the requirements of the trigger level. As a result, the CES element 304 maintains the high impedance state without switching to the low impedance state. In an embodiment, the requirement for the CES element 304 to switch from the high impedance state to the low impedance state requires a voltage of 1.2 V or above, and the compliance current to exceed the compliance current (10 uA).

Figure 9:
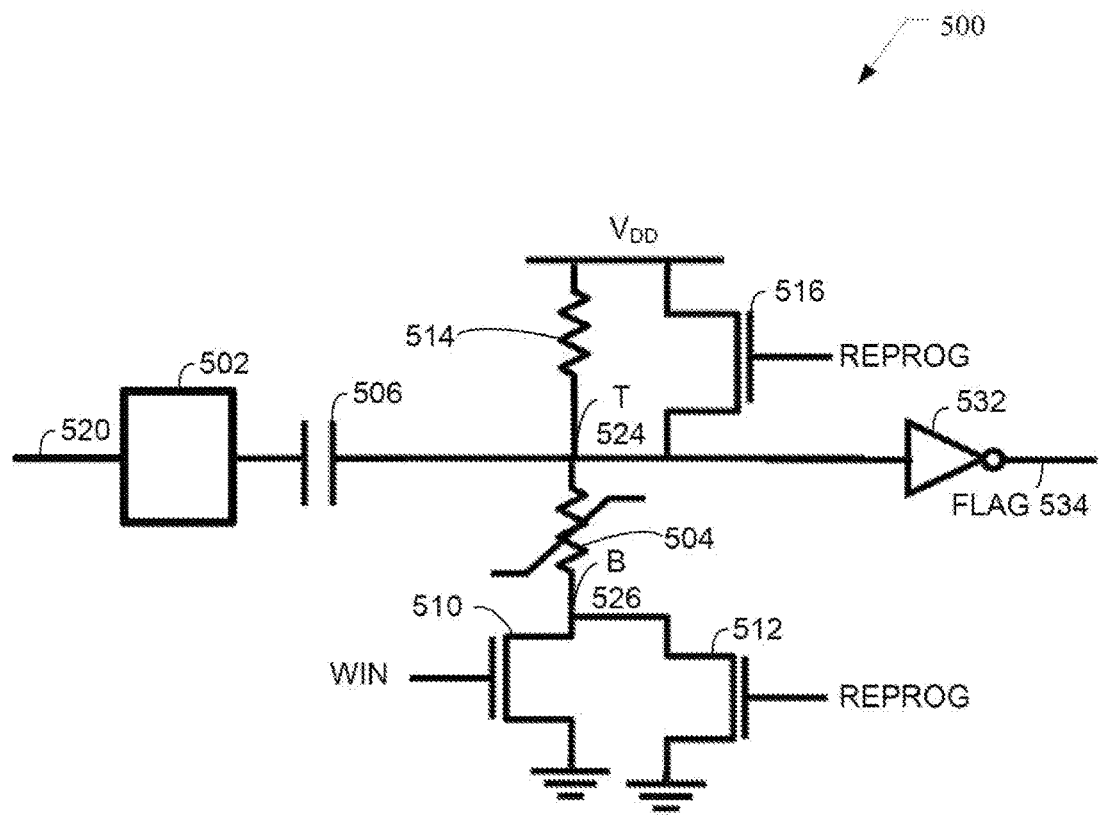
FIG. 9 illustrates an alternative implementation of the integrated circuit of FIG. 5, according to one embodiment.

FIG. 9 is an alternative implementation of the integrated circuit of FIG. 5, according to one embodiment. In one implementation, a pulse generator 502 may be used in the circuit 500 to generate a rising pulse out of a rising transition on signal 520. In an embodiment, the pulse generator 502 may be comprised of two pulse generator units. The two pulse generator units are used to generate a rising pulse out of both rising and falling transitions. The output of the pulse generator units may be "OR"-ed together to create a composite circuit that generates a rising pulse out of both rising and falling transitions on 520. The output of circuitry 502 may be coupled to the node T 524 through capacitor 506. Circuit 500 monitors the output of the pulse generator 502 instead of monitoring the input signal 520. The output of the pulse generator 502 in response to the transition is provided to the capacitor 506. For the sake of brevity, circuit elements 504-534 are not described as the circuit elements function in manner similar to circuit elements 304-334 as described in conjunction with FIG. 5.

In a scenario, where there is a high voltage transition on the input signal 520 during the time window WIN, to the pulse generator 502 receives the voltage transition on the input signal 520. The pulse generator 502 receives the voltage transition and generates a high transient voltage pulse in response to the voltage transition. The capacitor 506 receives the transient voltage pulse and couples additional charge to the node T 524. Also, the capacitor 506 provides necessary compliance current to the node T 524 to effect the transition. As described above, the CES element 504 which is set to the first trigger voltage, switches to the low impedance state in response to the additional transient voltage and the compliance current at the node T 524. The capacitor 506 may provide the compliance current required for the transition.

In a scenario, where there is a low voltage transition on the input signal 520 during the time window WIN, the pulse generator 502 receives the voltage transition on the input signal 520. The pulse generator 502 receives the voltage transition and inverts the low transition voltage to generate a high transient voltage pulse. The capacitor 506 receives the transient voltage pulse and in response to the transient voltage pulse generates a fractional transient voltage to the node T 524. Also, the capacitor 506 provides necessary compliance current to the node T 524 to effect the transition. The CES element 504 set up to the first trigger voltage, switches to the low impedance state in response to the transient voltage at the node T 524. As a result, both raising edge (high voltage transition) and falling edge (low voltage transition) due to fault events can be monitored and recorded.

The circuit 200 can also be used in detecting fault events such as voltage droop and ground bounce. The voltage droop condition is a loss of load voltage while driving multiple loads from a same source. The ground bounce condition is temporary change in ground voltage as a result of switching activity in the integrated circuit.

Figure 10:
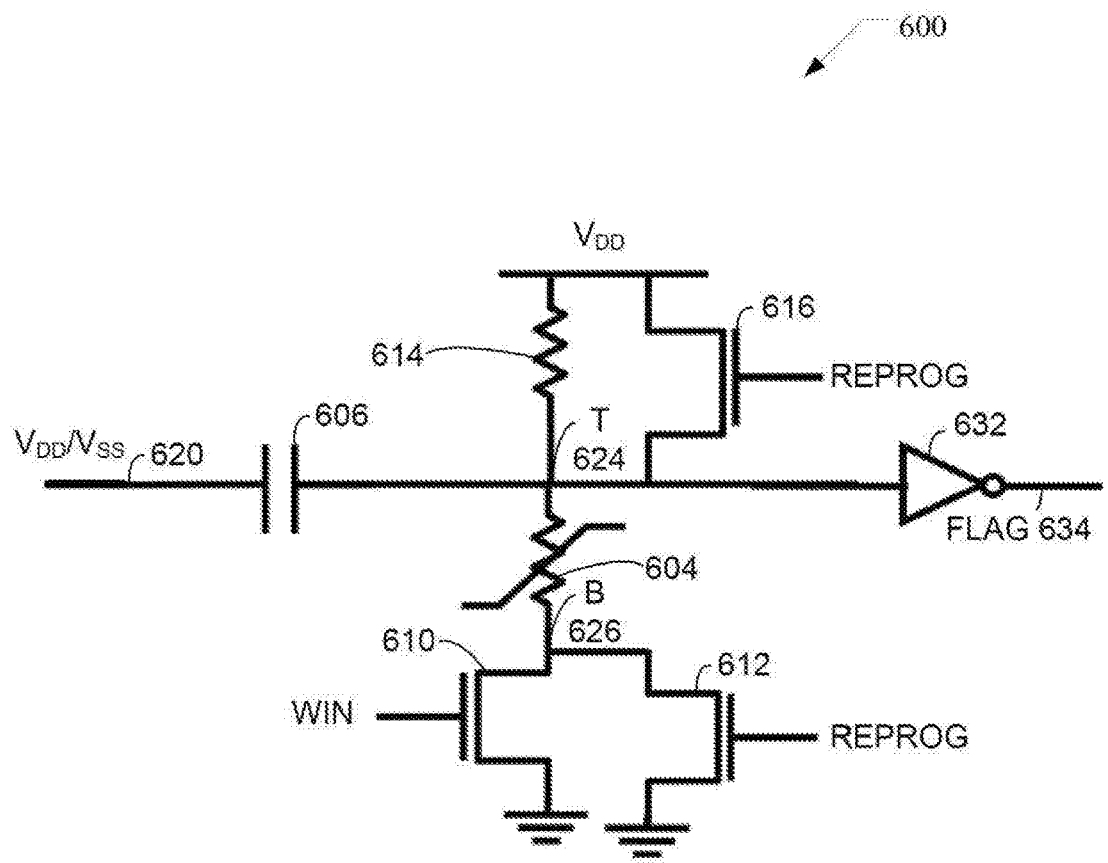
FIG. 10 illustrates an exemplary circuit for detecting a voltage droop and a ground bounce, according to one embodiment.

FIG. 10 illustrates an exemplary circuit 600 for detecting a voltage droop and a ground bounce, according to one embodiment. The circuit 600 is substantially similar to the circuit illustrated in FIG. 5, with an exception that input signal 620 is coupled to a $V_{DD}$ supplied by a circuit element under observation for detecting the voltage droop, and input signal 620 is coupled to a $V_{SS}$ of a circuit element under observation for detecting the ground bounce.

For sake of brevity, the circuit 600 is not elaborated in detail here as the functioning of circuit 600 is similar as that of the circuit 300. For detecting the voltage droop, an input signal 620 is coupled to the $V_{DD}$ supplied by the circuit element under observation. In some embodiments, the circuit 600 may be modified by connecting the capacitor 606 to the node B 326 instead of the node T 624 to detect voltage droop. The circuit 600 detects the voltage droop when there is a voltage transition in a form of some voltage loss at the input signal 620. The voltage transition is recorded as the fault event by the CES element 304.

For detecting the ground bounce, input signal 620 is coupled to a VSS of the circuit element under observation. The circuit 600 detects the ground, when there is a voltage transition in a form of change in ground voltage at the input signal 620. The voltage transition is recorded as the fault event by the CES element 604. The recorded fault events can be analyzed even when the power supply is disconnected, aiding the designer/tester to identify the circuit element under observation at fault.

Figure 11:
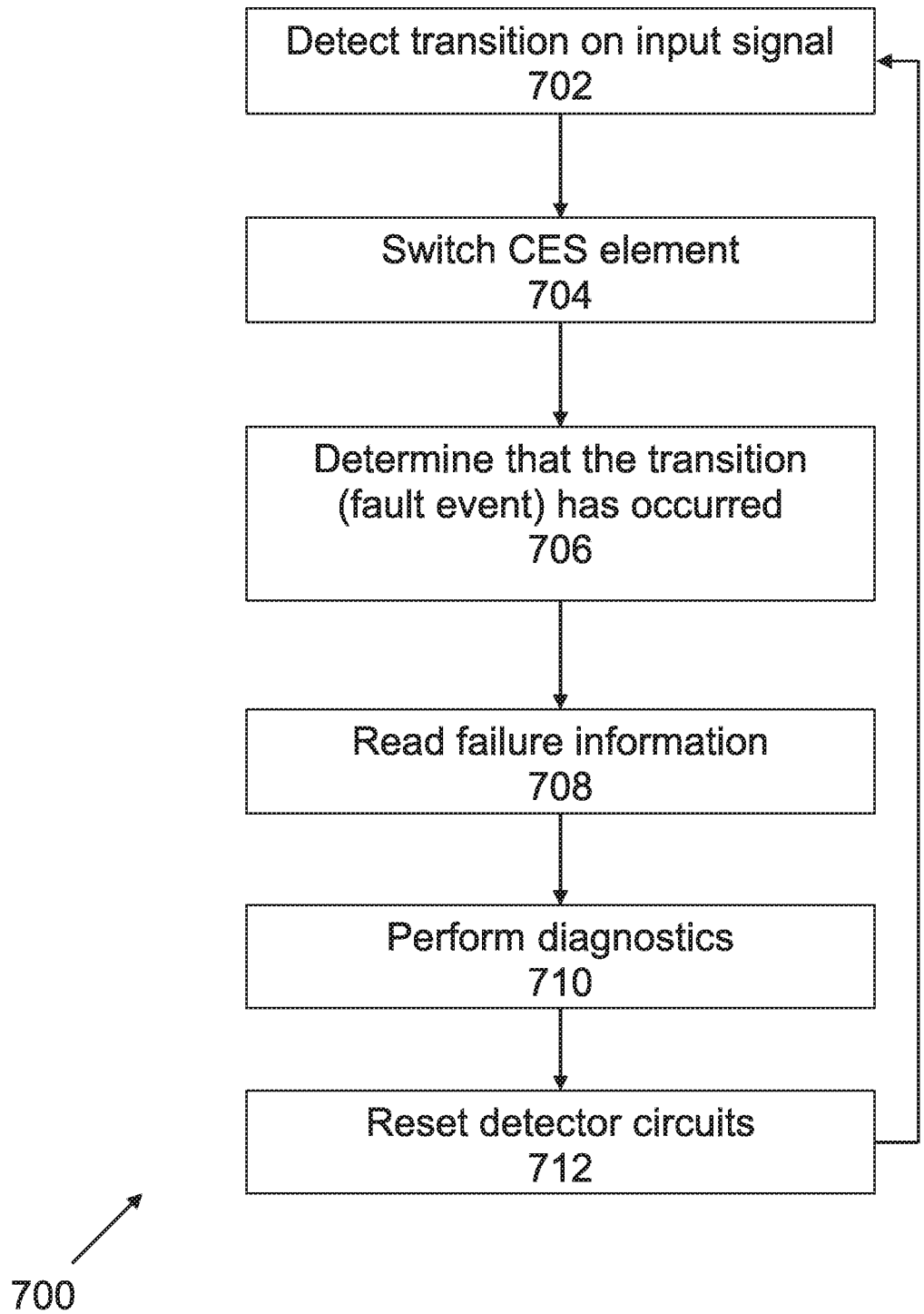
FIG. 11 illustrates a method for detecting a fault event, according to one embodiment.

FIG. 11 illustrates a method 700 for detecting a fault event, according to one embodiment. In step 702, a transition on an input signal is detected. In step 704, a CES element is switched from a first impedance state to a second impedance state responsive to the transition. In step 706, the transition is determined to have occurred responsive to the CES element switching from the first impedance state to the second impedance state. The method may further comprise generating a flag indicating the occurrence of the fault event, as described above.

In step 708, the method comprises reading failure information encoded by the CES elements that underwent an impedance state change, which may be in response to generating a flag. The failure information is used to perform system diagnostics testing/debugging and failure analysis (step 710). Once the diagnostics/debugging is completed, the circuits (detector circuits) used to detect the transition on the input signal are reset (using a REPROG signal, as described earlier) to enable them to detect further transitions/fault events (step 712). The detection method then begins again.

The transition on the input signal may be due to a failure or a fault. The failure information thus encoded by the CES elements undergoing an impedance state change can then be read or accessed later in order for system debug. Upon completion of the necessary diagnostics and failure analysis, all CES elements within the integrated circuit can then be reset to the first impedance state. This then readies the system to be used again for monitoring subsequent failures.

Although illustrative embodiments of the disclosure have been described in detail herein with reference to the accompanying drawings, it is to be understood that the disclosure is not limited to those precise embodiments, and that various changes and modifications can be effected therein by one skilled in the art without departing from the scope and spirit of the disclosure as defined by the appended claims.

The invention claimed is:

1. A circuit comprising:
 a Correlated Electron Switch (CES) element comprising a first input configured to receive an input signal, the CES element being in a first impedance state;
 a programming circuit coupled to the CES element and configured to switch the CES element from the first impedance state to a second impedance state in response to a transition on the input signal; and
 an output element coupled to the first input of the CES element to generate a flag signal responsive to the CES element switching to the second impedance state indicating that an event relating to the input signal has occurred.

2. The circuit of claim 1, wherein the programming circuit further comprises:

a capacitive element coupled to the input signal and the first input of the CES element, the capacitive element configured to induce a transient signal in response to the transition, wherein the programming circuit switches the CES element to the second impedance state based at least in part upon the transient voltage.

3. The circuit of claim 2, further comprising:
an input element comprising a transmission gate or a pulse generator, the input element configured to couple the transition on the input signal to the capacitive element.

4. The circuit of claim 2, wherein the capacitive element is an on-chip capacitor.

5. The circuit of claim 1, wherein the transition occurs, at least in part, in response to a fault event, and wherein the fault event comprises an ageing-related timing failure, a single event upset, a voltage droop condition or a ground bounce condition, or a combination thereof.

6. The circuit of claim 1, wherein the programming circuit further comprises:
a first resistor coupled between the first input and a first supply voltage; and
a first transistor coupled between a second input of the CES element and a second supply voltage, wherein the first transistor is configured to:
turn on a current path through the CES element for a predetermined period of time; and
turn off the current path after the predetermined period of time.

7. The circuit of claim 1, wherein the programming circuit is configured to:
supply a first signal to the CES element up to a first trigger level; and
provide a transient signal in addition to the first signal to cause the CES element to switch from the first impedance state to the second impedance state, wherein the first signal and the transient signal comprises a voltage and a current, wherein the first trigger level comprises a threshold voltage or a threshold current above which the CES element switches from the first impedance state to the second impedance state.

8. The circuit of claim 1, further comprising a reset circuit configured to change the impedance state of the CES element from the second impedance state to the first impedance state.

9. The circuit of claim 1, wherein the first impedance state comprises a high impedance state and the second impedance state comprises a low impedance state.

10. A method comprising:
detecting a transition on an input signal;
switching a Correlated Electron Switch (CES) element from a first impedance state to a second impedance state responsive to the transition; and
generating a flag signal responsive to the switching of the CES element from a first impedance state to a second impedance state to indicate an occurrence of an event relating to the input signal.

11. The method of claim 10, further comprising:
inducing a transient signal in response to the transition; and
switching the CES element to the second impedance state based at least in part upon the transient signal.

12. The method of claim 10, wherein the transition occurs, at least in part, in response to a fault event, and wherein the fault event comprises an ageing-related timing failure, a single event upset, a voltage droop condition or a ground bounce condition, or a combination thereof.

13. The method as claimed in claim 10 further comprising: reading failure information, in response to the flag signal, the failure information providing data on a fault event; and performing failure analysis to determine the type of fault event.

14. An integrated circuit comprising:
at least one circuit element; and
a fault monitor element of the at least one circuit element, the fault monitor element comprising:
a Correlated Electron Switch (CES) element comprising a first input configured to receive an input signal, the CES element being in a first impedance state;
a programming circuit coupled to the CES element and configured to switch the CES element from the first impedance state to a second impedance state in response to a transition on the input signal; and
an output element coupled to the first input of the CES element to generate a flag signal responsive to the CES element switching to the second impedance state indicating that an event relating to the input signal has occurred.

15. The integrated circuit of claim 14, wherein the fault monitor element further comprising a capacitive element coupled to the input signal and the CES element, and configured to induce a transient signal in response to the transition, wherein the CES element switches to the second impedance state based at least in part upon the transient signal.

16. The integrated circuit of claim 15, wherein one or more circuit elements of the at least one circuit element exhibiting a fault event are able to be identified based upon flag signals from corresponding fault monitor elements.

17. The integrated circuit of claim 14, wherein the transition occurs, at least in part, in response to a fault event, and wherein the fault event comprises an ageing-related timing failure, a single event upset, a voltage droop condition or a ground bounce condition, or a combination thereof.

18. The integrated circuit of claim 14, further comprising an indicator unit to:
receive flag signals from one or more fault monitor elements associated with one or more circuit elements; and
generate a combined flag signal from the flag signals.

* * * * *